(12) United States Patent
Ogawa et al.

(10) Patent No.: US 9,798,613 B2
(45) Date of Patent: Oct. 24, 2017

(54) CONTROLLER OF NONVOLATILE SEMICONDUCTOR MEMORY

(71) Applicant: TOSHIBA MEMORY CORPORATION, Minato-ku (JP)

(72) Inventors: Masaru Ogawa, Ebina (JP); Kenji Sakurada, Yamato (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/206,315

(22) Filed: Mar. 12, 2014

(65) Prior Publication Data

US 2015/0188577 A1    Jul. 2, 2015

Related U.S. Application Data

(60) Provisional application No. 61/921,136, filed on Dec. 27, 2013.

(51) Int. Cl.
*H03M 13/00* (2006.01)
*G06F 11/10* (2006.01)
(Continued)

(52) U.S. Cl.
CPC .......... *G06F 11/10* (2013.01); *G06F 11/1012* (2013.01); *H03M 13/1111* (2013.01);
(Continued)

(58) Field of Classification Search
CPC ............. H03M 13/11; H03M 13/1154; H03M 13/1125; H03M 13/6337; H03M 13/2906;
(Continued)

(56) References Cited

U.S. PATENT DOCUMENTS

| 5,596,589 A * | 1/1997 | Thomsen ................ G06F 11/10 714/759 |
| 7,904,780 B2 * | 3/2011 | Brandman .......... G06F 11/1068 714/752 |

(Continued)

FOREIGN PATENT DOCUMENTS

| JP | 2010-171905 | 8/2010 |
| JP | 2011-81858 | 4/2011 |

(Continued)

OTHER PUBLICATIONS

U.S. Appl. No. 13/946,449, filed Jul. 19, 2013, Sakurada, et al.

*Primary Examiner* — Albert Decady
*Assistant Examiner* — Osman M Alshack
(74) *Attorney, Agent, or Firm* — Oblon, McClelland, Maier & Neustadt, L.L.P.

(57) ABSTRACT

According to one embodiment, a controller includes a decoder, calculation section, table creation, and control section. The decoder converts ECC frames into likelihood information based on a set table, generates decoded ECC frames by decoding using the likelihood information and switches the set table when there is an ECC frame in which the decoding is unsuccessful. The calculation section generates calculation data based on an ECC frame of calculation target among the decoded ECC frames and its ECC frame before decoded. The table creation section sets the new table to the decoder based on the calculation data. The control section controls the calculation target so that a calculation in the calculation section is not repeated for an ECC frame in which the decoding is successful.

16 Claims, 8 Drawing Sheets

(51) Int. Cl.
*H03M 13/11* (2006.01)
*H03M 13/29* (2006.01)
*H03M 13/37* (2006.01)
*H03M 13/15* (2006.01)

(52) U.S. Cl.
CPC ... *H03M 13/2906* (2013.01); *H03M 13/3723* (2013.01); *H03M 13/3746* (2013.01); *H03M 13/6337* (2013.01); *H03M 13/152* (2013.01)

(58) Field of Classification Search
CPC ......... H03M 13/3723; H03M 13/3746; H03M 13/1111; H03M 13/152; H03M 13/1102; G11B 2020/185; G06F 11/10; G06F 11/1012
USPC .......................................... 714/752, 759, 780
See application file for complete search history.

(56) References Cited

U.S. PATENT DOCUMENTS

| | | | |
|---|---|---|---|
| 8,250,437 B2 | 8/2012 | Sakurada et al. | |
| 8,385,117 B2 | 2/2013 | Sakurada et al. | |
| 8,462,549 B2 | 6/2013 | Haratsch et al. | |
| 8,526,230 B2 | 9/2013 | Haratsch et al. | |
| 8,634,250 B2 | 1/2014 | Haratsch et al. | |
| 8,856,611 B2 * | 10/2014 | Wu | G11C 29/52 714/752 |
| 9,213,600 B2 | 12/2015 | Cohen et al. | |
| 2008/0244360 A1* | 10/2008 | Mokhlesi | G06F 11/1068 714/758 |
| 2010/0088575 A1* | 4/2010 | Sharon | G06F 11/1072 714/763 |
| 2010/0223538 A1* | 9/2010 | Sakurada | G06F 11/1072 714/801 |
| 2011/0138114 A1 | 6/2011 | Yen | |
| 2011/0145487 A1 | 6/2011 | Haratsch et al. | |
| 2011/0167305 A1 | 7/2011 | Haratsch et al. | |
| 2011/0216586 A1 | 9/2011 | Graef et al. | |
| 2011/0219284 A1* | 9/2011 | Uchikawa | G06F 11/10 714/763 |
| 2011/0225350 A1* | 9/2011 | Burger, Jr. | G11C 7/02 711/103 |
| 2011/0239089 A1 | 9/2011 | Haratsch et al. | |
| 2011/0289382 A1* | 11/2011 | Shih | H03M 13/1137 714/763 |
| 2011/0305082 A1 | 12/2011 | Haratsch et al. | |
| 2012/0297273 A1* | 11/2012 | Sakaue | G06F 11/1048 714/773 |
| 2013/0024605 A1* | 1/2013 | Sharon | G06F 11/1072 711/103 |
| 2013/0077400 A1 | 3/2013 | Sakurada | |
| 2014/0143637 A1* | 5/2014 | Cohen | H03M 13/1108 714/773 |
| 2015/0149871 A1* | 5/2015 | Chen | G06F 11/1068 714/773 |

FOREIGN PATENT DOCUMENTS

| | | |
|---|---|---|
| JP | 2012-514819 | 6/2012 |
| JP | 2012-181761 | 9/2012 |
| JP | 2013-80450 | 5/2013 |
| JP | 5197544 | 5/2013 |

* cited by examiner

| | Er | | | A | | | B | | | C | | | D | | | E | | | F | | | G | |
|---|---|---|---|---|---|---|---|---|---|---|---|---|---|---|---|---|---|---|---|---|---|---|---|---|
| Lower | 1 | 1 | 1 | 0 | 0 | 0 | 0 | 0 | 0 | 0 | 1 | 1 | 1 | 0 | 0 | 0 | 1 | 1 | 1 | 1 | 1 | 1 | 1 | 1 |
| ENOR (SB1) | 1 | 1 | 0 | 0 | 0 | 1 | 1 | 1 | 1 | 1 | 1 | 1 | 1 | 0 | 0 | 1 | 1 | 0 | 1 | 1 | 1 | 1 | 1 | 1 |
| ENOR3 (SB2) | 1 | 0 | 0 | 0 | 1 | 0 | 1 | 1 | 1 | 1 | 1 | 1 | 1 | 1 | 0 | 0 | 0 | 1 | 1 | 1 | 1 | 1 | 1 | 1 |
| Cread (SB3) | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 0 | 0 |
| index | 15 | 11 | 9 | 13 | 12 | 8 | 10 | 14 | 14 | 14 | 14 | 14 | 6 | 6 | 6 | 6 | 2 | 0 | 4 | 5 | 1 | 3 | 7 | 7 | 7 | 7 | 7 | 7 | 7 |

| | 1111 | 1011 | 1001 | 1101 | 1100 | 1000 | 1010 | 1110 |
|---|---|---|---|---|---|---|---|---|
| 0 | 271411 | 41298 | 31484 | 40406 | 150049 | 459742 | 761546 | 23104878 |
| 1 | 12251722 | 4184 | 2189 | 3161 | 7164 | 11397 | 9456 | 16104 |

| | 0110 | 0010 | 0000 | 0100 | 0101 | 0001 | 0011 | 0111 |
|---|---|---|---|---|---|---|---|---|
| 0 | 21731356 | 1224247 | 904958 | 398098 | 223070 | 76170 | 36481 | 20366 |
| 1 | 48376 | 46979 | 113164 | 178937 | 397878 | 522847 | 1091913 | 34791129 |

FIG. 6

| | 0 | 1 | 2 | 3 | 4 | 5 | 6 | 7 |
|---|---|---|---|---|---|---|---|---|
| 0 | [0][0] | [0][1] | [0][2] | [0][3] | [0][4] | [0][5] | [0][6] | [0][7] |
| 1 | [1][0] | [1][1] | [1][2] | [1][3] | [1][4] | [1][5] | [1][6] | [1][7] |

| | 8 | 9 | 10 | 11 | 12 | 13 | 14 | 15 |
|---|---|---|---|---|---|---|---|---|
| 0 | [0][8] | [0][9] | [0][10] | [0][11] | [0][12] | [0][13] | [0][14] | [0][15] |
| 1 | [1][8] | [1][9] | [1][10] | [1][11] | [1][12] | [1][13] | [1][14] | [1][15] |

FIG. 7

|  | Block A | Block B | | | | Block C | Block D |
|---|---|---|---|---|---|---|---|
| wordline 0 | | Frame 0 | Frame 1 | Frame 2 | Frame 3 | | |
| wordline 1 | | Frame 0 | Frame 1 | Frame 2 | Frame 3 | | |
| wordline 2 | | Frame 0 | Frame 1 | Frame 2 | Frame 3 | | |
| ⋮ | | | | | | | |
| wordline 85 | | Frame 0 | Frame 1 | Frame 2 | Frame 3 | | |

CONTROLLER OF NONVOLATILE SEMICONDUCTOR MEMORY

CROSS-REFERENCE TO RELATED APPLICATIONS

This application claims the benefit of U.S. Provisional Application No. 61/921,136, filed Dec. 27, 2013, the entire contents of which are incorporated herein by reference.

FIELD

Embodiments described herein relate generally to a controller of a nonvolatile semiconductor memory.

BACKGROUND

Generally, a memory controller with a low density parity check (LDPC) decoding function converts data read from a nonvolatile semiconductor memory into a log-likelihood ratio (LLR) using an LLR table created in advance, and corrects an error included in the data.

A likelihood of write data (i.e., a correct bit value) corresponding to readout data varies depending upon a stress on a memory area of the readout data. There are typical stresses e.g., program disturb (PD), data retention (DR), and read disturb (RD). In accordance with such typical stresses, a plurality of LLR tables are pre-created. However, even when the LLR tables are prepared, it is difficult to adapt for all various stresses to which memory cells in the nonvolatile semiconductor memory may be subject. That is, even if the LLR tables are prepared in advance, it may be impossible to suppress a deterioration of error correctability under a part of given unexpected stress (e.g., a composite stress of the DR stress and RD stress).

DETAILED DESCRIPTION

Embodiments will be described hereinafter with reference to the drawing. In the following description, the same reference numerals denote components having nearly the same functions and arrangements, and a repetitive description thereof will be given if necessary.

In general, according to one embodiment, a controller includes a decoder, calculation section, table creation section, and control section. The decoder converts a plurality of error correction code (ECC) frames read out from a nonvolatile semiconductor memory into likelihood information based on a set table among a plurality of tables, generates a plurality of decoded ECC frames by decoding using the likelihood information and switches the set table when there is an ECC frame in which the decoding is unsuccessful. The calculation section generates calculation data based on an ECC frame of calculation target among the plurality of decoded ECC frames and an ECC frame before decoded, which corresponds to the ECC frame of the calculation target. The table creation section creates a new table by executing statistical calculation based on the calculation data generated by the calculation section and sets the new table to the decoder. The control section controls the calculation target so that a calculation in the calculation section is not repeated for an ECC frame in which the decoding is successful.

First Embodiment

A controller of a nonvolatile semiconductor memory according to a first embodiment includes a data correction function by LDPC and a DLE function. A DLE is a technique capable of correcting an error in an unsuccessfully-decoded LDPC frame by calculating data before and after decoded of a successfully-decoded LDPC frame accepting a similar level stress for the unsuccessfully-decoded LDPC frame, and creating a new LLR table appropriate to the stress. The detail of the DLE, more specifically, generation of calculation data and creation of the new LLR table, will be explained in a second embodiment.

While it is explained in the first embodiment that LDPC decoding is applied as an example of ECC decoding and that an LDPC frame is used as an example of an ECC frame, the type of decoding for an error correction coding and the type of an error correction coding frame are not limited thereto.

Figure 1:
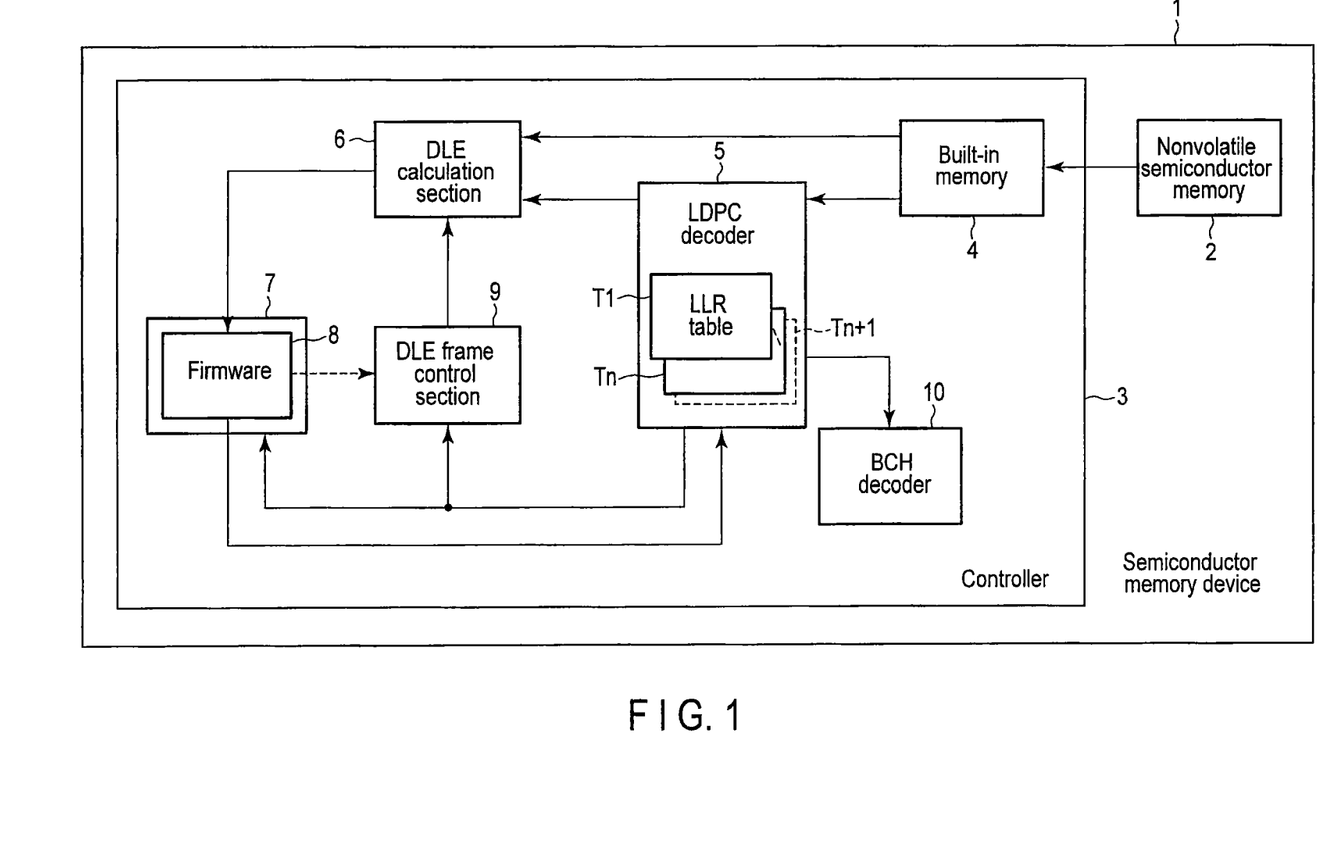
FIG. 1 is a block diagram showing an example of a configuration of a controller of a nonvolatile semiconductor memory according to a first embodiment.

FIG. 1 is a block diagram showing an example of the controller of the nonvolatile semiconductor memory according to the first embodiment.

A semiconductor memory device 1 comprises a nonvolatile semiconductor memory 2 and a controller 3.

The nonvolatile semiconductor memory 2 is, for example, a NAND flash memory, but may be a different nonvolatile semiconductor memory such as a NOR flash memory, a magnetoresistive random access memory (MRAM), a phase change random access memory (PRAM), a resistive random access memory (ReRAM) and a ferroelectric random access memory (FeRAM).

The controller 3 controls writing and reading out data for the nonvolatile semiconductor memory 2.

The controller 3 includes a built-in memory 4, an LDPC decoder 5, a DLE calculation section 6, firmware 8 executed by a processing section 7, a DLE frame control section 9 and a Bose-Chaudhuri-Hocquenghem (BCH) decoder 10. Note that the firmware 8 may be a table creation section. In the first embodiment, a part or the whole of an operation of the firmware 8 may be realized by hardware. By contrast, a part or the whole of the functions of the LDPC decoder 5, the DLE calculation section 6, the DLE frame control section 9 and the BCH decoder 10, all of which are realized by hardware in the first embodiment, may be realized by software.

The controller 3, includes the LDPC decoder 5 and the BCH decoder 10, performs BCH decoding by the BCH decoder 10 after LDPC decoding by the LDPC decoder 5. While it is explained in the first embodiment that four LDPC frames are read out from the nonvolatile semiconductor memory 2, the number of LDPC frames read out from the nonvolatile semiconductor memory 2 is not limited thereto. Also, while it is explained in the first embodiment that four LDPC frames correspond to one BCH frame, the number of LDPC frames to one BCH frame can be changed variously.

The built-in memory 4 stores the data read out from the nonvolatile semiconductor memory 2. The readout data includes four LDPC frames, which are error-correction-coded.

The LDPC decoder 5 sets any of a plurality of LLR tables T1-Tn. The plurality of LLR tables T1-Tn may be set to the LDPC decoder 5 by the firmware 8. It may also be possible that the LLR tables T1-Tn are provided in the LDPC decoder 5 in advance and are set to the LDPC decoder 5 in accordance with a control from the firmware 8. Alternatively, the LLR tables T1-Tn are provided in the LDPC decoder 5 in advance and the LDPC decoder 5 itself may perform setting.

The LDPC decoder 5 reads out four LDPC frames from the built-in memory 4.

The LDPC decoder 5 converts the readout four LDPC frames into likelihood information based on the set LLR tables among the plurality of LLR tables T1-Tn, and generates four decoded LDPC frames by decoding using the likelihood information.

The LDPC decoder 5 determines decoding as valid only when all the four LDPC frames are successfully decoded. On the other hand, when not all the four LDPC frames are successfully decoded (at lease one fails), the LDPC decoder 5 changes the set LLR table to retry decoding for the four LDPC frames. The LDPC decoder 5 iteratively performs processing until all the four LDPC frames are successfully decoded by using the set table or until decoding is performed based on all the plurality of LLR tables T1-Tn.

The LDPC decoder 5 performs decoding for the four LDPC frames based on new LLR tables Tn+1 created in the firmware 8 executed by the processing section 7, when not all the four LDPC frames are successfully decoded by using the set table although decoding is performed based on all the plurality of LLR tables T1-Tn.

The LDPC decoder 5 transmits to the DLE calculation section 6 a successfully decoded LDPC frame among the four decoded LDPC frames. The LDPC decoder 5 also transmits to the DLE frame control section 9 and the firmware 8 a result of the decoding showing whether decoding of each of the four LDPC frames is successful or not.

The DLE calculation section 6 receives a successfully-decoded LDPC frame from the LDPC decoder 5. Note that the DLE calculation section 6 may read out only LDPC frame of calculation target selected by the DLE frame control section 9 among the successfully-decoded LDPC frames, from the LDPC decoder 5.

The DLE calculation section 6 receives four LDPC frames before decoded from the built-in memory 4. Note that the DLE calculation section 6 may read out from the built-in memory 4 only the LDPC frames before decoded corresponding to the LDPC frames of the calculation target.

The DLE calculation section 6 generates calculation data based on a switch control of the calculation target by the DLE frame control section 9, the LDPC frames of the calculation target among the successfully-decoded LDPC frames, and the LDPC frames before decoded corresponding to the LDPC frames of the calculation target. In other words, the LDPC frames of the calculation target are LDPC frames that have been successfully decoded but have not been subject to calculation yet. For example, the DLE calculation section 6 applies the calculation only for LDPC frames that have been successfully decoded for the first time and selects the calculation target so as not to repeat the calculation for the successfully-decoded LDPC frame. As a result, the DLE calculation section 6 once calculates each of the four LDPC frames when decoding is successful.

For example, the DLE calculation section 6 may include four switches corresponding to the four decoded LDPC frames. In this case, based on the switch control by the DLE frame control section 9, the four switches are turned on only once when the allocated LDPC frame is successfully decoded while the switches are turned off when the allocated LDPC frame is unsuccessfully decoded and the allocated LDPC frame has been the calculation target already.

The firmware 8 executed by the processing section 7 receives from the DLE calculation section 6 the calculation data for the LDPC frames that are successfully decoded and are not overlapped, when decoding is performed by using all the plurality of LLR tables T1-Tn prepared in advance but there is no LLR table on which all the four LDPC frames are successfully decoded.

The firmware 8 executes a statistical calculation based on the calculation data from the DLE calculation section 6, creates a new LLR table Tn+1 and sets the new LLR table Tn+1 to the LDPC decoder 5. As mentioned above, when the new LLR table Tn+1 is set to the LDPC decoder 5, the LDPC decoder 5 performs decoding for the four LDPC frames based on the new LLR table Tn+1.

The firmware 8 confirms a decoding result of the LDPC decoder 5 and controls the DLE frame control section 9, when the LLR tables T1-Tn are changed so that the decoding is iteratively performed in the LDPC decoder 5.

In accordance with the decoding result of the LDPC decoder 5 and the control by the firmware 8, the DLE frame control section 9 controls switching of the calculation target in order to except for overlapping of the calculation for the same LDPC frame in the DLE calculation section 6, among the successfully-decoded LDPC frames. In more detail, the DLE frame control section 9 controls each of the four LDPC frames to be selected as the calculation target in the DLE calculation section 6 only once when decoding is successful.

The DLE frame control section 9 executes an initialization for the control of the calculation target, when new four LDPC frames are read out from the nonvolatile semiconductor memory 2.

The BCH decoder 10 performs BCH decoding for the four decoded LDPC frames, when all the four LDPC frames are successfully decoded.

In the following explanation, conventional DLE calculation target and DLE calculation target according to the first embodiment will be compared with reference to FIGS. 2 and 3.

Figure 2:
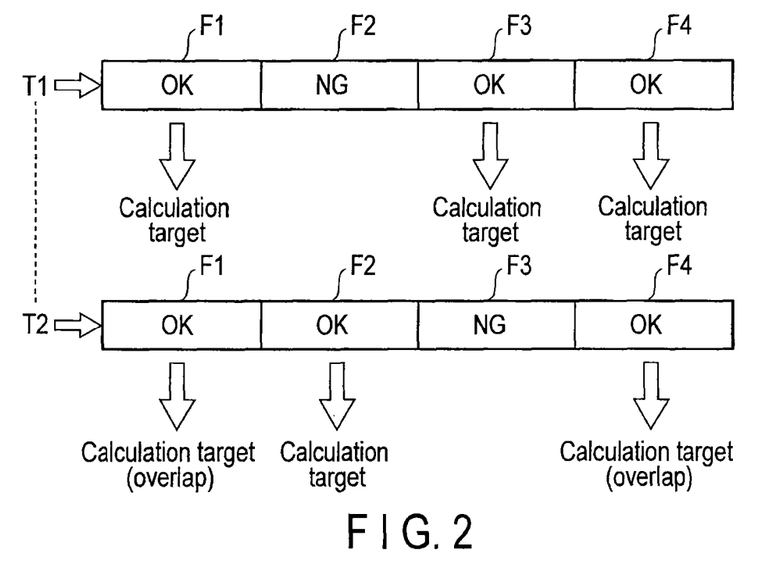
FIG. 2 is a diagram showing an example of LDPC frames of conventional calculation target.

FIG. 2 is a diagram showing an example of LDPC frames of conventional calculation target. It is supposed in FIG. 2 that two LLR tables T1 and T2 have been prepared in advance.

Firstly, a conventional LDPC decoder decodes LDPC frames F1-F4 by using the table T1. When LDPC frames F1, F3 and F4 are successfully decoded but LDPC frame F2 is unsuccessfully decoded, a conventional DLE calculation section determines that successfully-decoded LDPC frames F1, F3 and F4, are included in calculation target and executes calculations corresponding to LDPC frames F1, F3 and F4.

Next, when all LDPC frames F1-F4 are unsuccessfully decoded by using the table T1, the conventional LDPC decoder decodes the LDPC frames F1-F4 by using the LLR table T2 in lieu of the LLR table T1.

When the LDPC frames F1, F2 and F4 are successfully decoded but the LDPC frame F3 is unsuccessfully decoded, the conventional DLE calculation section determines that successfully-decoded LDPC frames F1, F2 and F4 are included in the calculation target and executes calculations corresponding to LDPC frames F1, F2 and F4.

When decoding of a plurality of LDPC frames F1-F4 is tried by using all LLR tables T1 and T2 prepared in advance but all LDPC frames F1-F4 are unsuccessfully decoded in either of decoding using the table T1 or table T2, a conventional firmware creates a new LLR table based on a calculation result corresponding to LDPC frames F1, F3 and F4 obtained from decoding using table T1 and a calculation result corresponding to LDPC frames F1, F2 and F4 obtained from decoding using the table T2. The conventional LDPC decoder decodes the LDPC frames F1-F4 by using the new LLR table.

Conventionally, all successfully-decoded LDPC frames become the calculation target to the DLE. As illustrated in the example of FIG. 2, a plurality of calculations for LDPC frames F1 and F4 are overlapped when LDPC frames F1 and F4 are successfully decoded in decoding using the LLR tables T1 and T2.

Thus, when a new LLR table is created by using the calculations based on same LDPC frame F1 and same LDPC frame F4, it may be possible that the calculation result obtained is biased to make the new LLR table nonoptimal and to reduce its accuracy.

Figure 3:
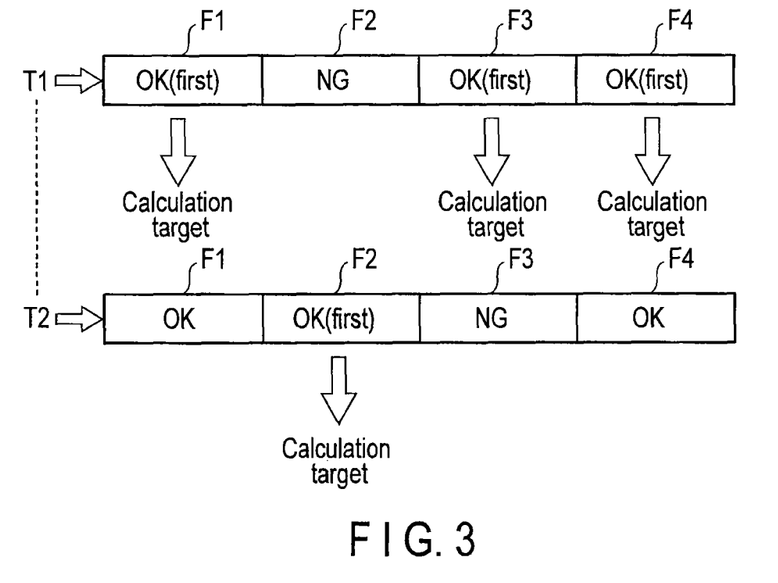
FIG. 3 is a diagram showing an example of LDPC frames of calculation target according to the first embodiment.

FIG. 3 is a diagram of an example of LDPC frames of calculation target according to the first embodiment. As with FIG. 2, it is supposed in FIG. 3 that two LLR tables T1 and T2 have been prepared in advance.

Firstly, the LDPC decoder 5 decodes LDPC frames F1-F4 by using the LLR table T1 in the first embodiment. When LDPC frames F1, F3 and F4 are successfully decoded but LDPC frame F2 is unsuccessfully decoded, the DLE frame control section 9 determines that LDPC frames F1, F3 and F4 that have been successfully decoded but have not been subject to calculation yet are included in calculation target.

The DLE calculation section 6 executes calculations corresponding to LDPC frames F1, F3 and F4 of the calculation target.

Next, when all LDPC frames F1-F4 are unsuccessfully decoded by using the table T1, the LDPC decoder 5 decodes LDPC frames F1-F4 by using the LLR table T2 in lieu of the LLR table T1.

When LDPC frames F1, F2 and F4 are successfully decoded but LDPC frame F3 is unsuccessfully decoded, the DLE frame control section 9 determines that LDPC frame F2 that has been successfully decoded but has not been the calculation target yet is included in the calculation target, and excludes from the calculation target LDPC frame F3 that has been unsuccessfully decoded and LDPC frames F1 and F4 that have been successfully decoded but have been already the calculation target in decoding using above-mentioned table T1. For example, the DLE frame control section 9 turns off the switch corresponding to an LDPC frame that has been once calculation target and excludes the LDPC frame that has been once calculation target from the calculation target thereafter.

The DLE calculation section 6 executes calculation corresponding to the LDPC frame F2 of the calculation target.

As a result, the calculation is executed only once for each of four LDPC frames F1-F4, and calculations for four frames at maximum are executed for four LDPC frames F1-F4.

Figure 4:
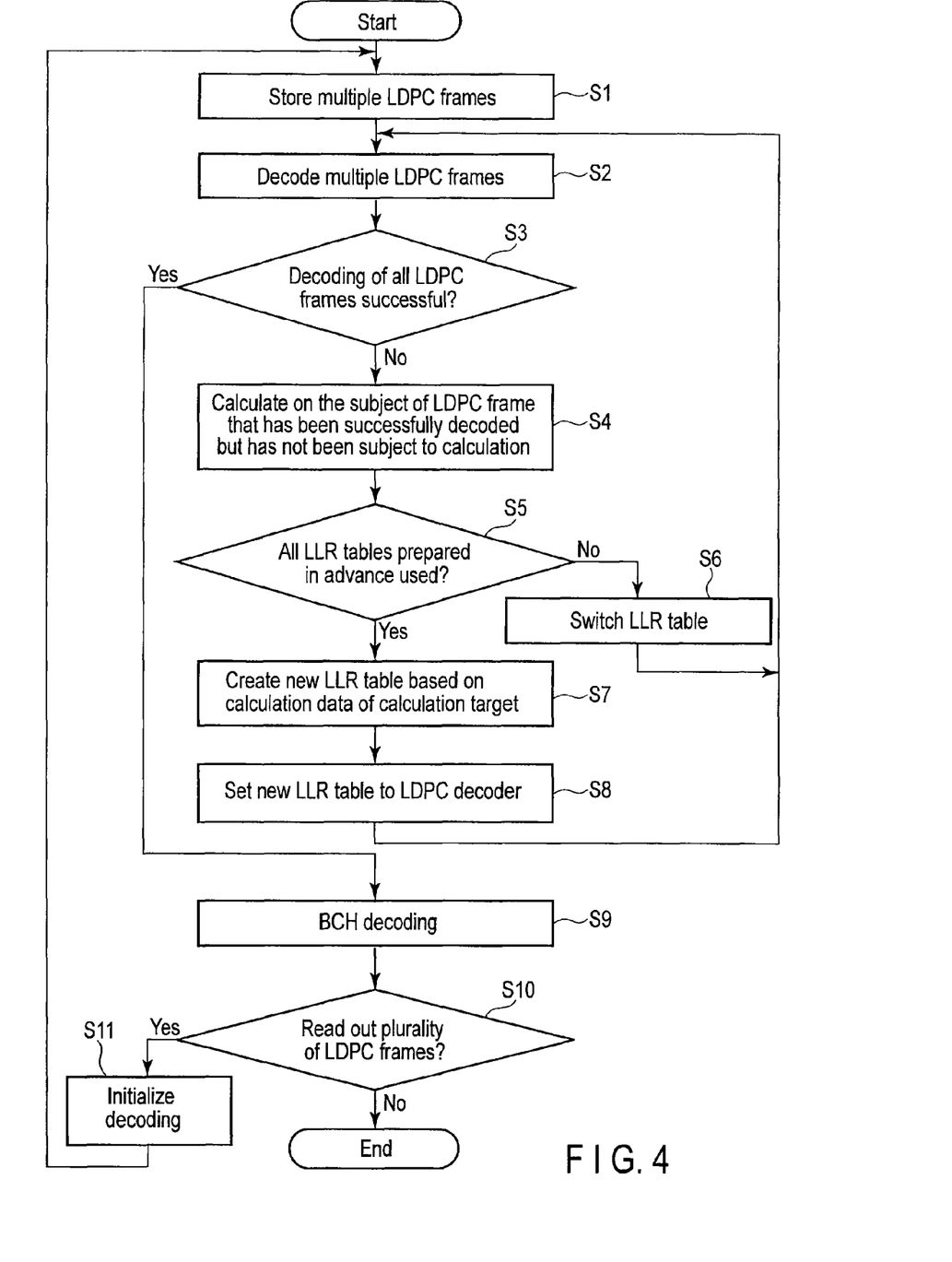
FIG. 4 is a flowchart showing an example of an operation of a controller according to the first embodiment.

FIG. 4 is a flowchart showing an example of an operation of the controller 3 according to the first embodiment.

In step S1, the built-in memory 4 stores the plurality of LDPC frames F1-F4 from the nonvolatile semiconductor memory 2.

In step S2, the LDPC decoder 5 decodes the plurality of LDPC frames F1-F4 based on the set LLR table.

In step S3, the LDPC decoder 5 determines whether all the plurality of LDPC frames F1-F4 are successfully decoded by using the set LLR table or not.

When all the plurality of LDPC frames F1-F4 are successfully decoded, a process advances to step S9.

When not all the plurality of LDPC frames F1-F4 are successfully decoded, the DLE calculation section 6 in step S4 calculates the LDPC frame that is successfully decoded but have not been the calculation target yet. Accordingly, the calculation for the successfully-decoded LDPC frame is not repeated.

In step S5, the LDPC decoder 5 determines whether or not decoding is performed by using all LLR tables T1-Tn prepared in advance.

When decoding has not been performed by using all LLR tables T1-Tn, the LDPC decoder 5 in step S6 switches the set LLR table to an LLR table that has not been set yet, and the process advances to step S2.

When decoding has been performed by using all LLR tables T1-Tn, the firmware 8 in step S7 executes the statistic calculation based on the calculation data for LDPC frames of the calculation target and creates the new LLR table Tn+1.

In step S8, the firmware 8 sets the new LLR table Tn+1 and the process advances to S2.

In step S9, the BCH decoder 10 performs the BCH decoding for a plurality of decoded LDPC frames F1-F4, when all LDPC frames F1-F4 are successfully decoded by using the set LLR table.

In step S10, the controller 3 determines whether or not a plurality of new LDPC frames are read out from the nonvolatile semiconductor memory 2.

When the plurality of new LDPC frames are read out from the nonvolatile semiconductor memory 2, the initialization is executed in step S11 for the control of the calculation target of the controller 3, and the process advances to step S1.

When the plurality of new LDPC frames are not read out from the nonvolatile semiconductor memory 2, the process is terminated.

In the first embodiment explained above, the DLE calculation section 6 selects LDPC frames of the calculation target and the firmware 8 and the DLE frame control section 9 perform a control to prevent the calculation for each of LDPC frames F1-F4 from overlapping. This improves the accuracy of the new LLR table Tn+1 created by the firmware 8 and the performance of LDPC decoding.

Second Embodiment

In a second embodiment, the examples of LDPC decoding and the DLE used in the first embodiment above will be explained.

The controller 3 reads out data (for example, the LDPC frames) stored in the nonvolatile semiconductor memory 2 and corrects an error included in the readout data. Note that the controller 3 may also have a function to error-correction-code data and a function to write the error-correction-coded data in the nonvolatile semiconductor memory 2.

Data readout from the nonvolatile semiconductor memory 2 is supplied to the LDPC decoder 5. The read out data includes not only a hard-decision bit value for each of a plurality of bits forming the LDPC frame, but also a plurality of (e.g., three) soft-decision bit values for each of the plurality of bits. In other words, the readout data indicates the read level of each of the plurality of bits forming the LDPC frame. In the following explanation, the LDPC frame may also be separated into a plurality of chips (a plurality of channel matrices). Note that the LDPC decoder 5 can also receive the readout data via a memory interface (not shown).

Figure 5:
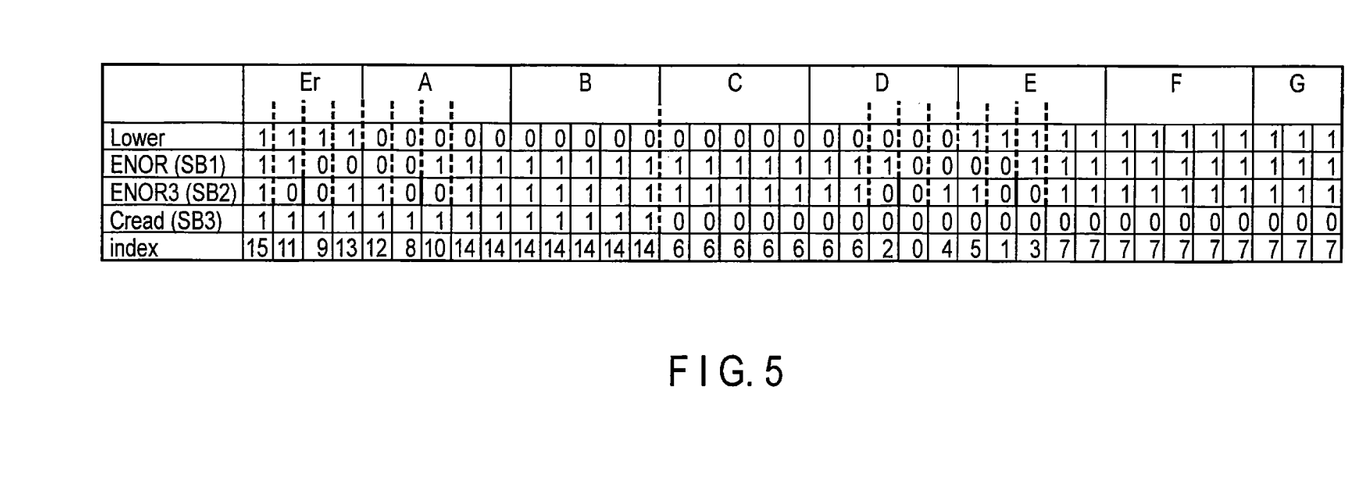
FIG. 5 is a view showing an example of readout data of a lower page from a nonvolatile semiconductor memory.

In a so-called 2-3-2 code type as shown in FIG. 5, a lower page (i.e., the least significant bit stored in a memory cell) is read out by using two threshold voltages. More specifically, assume that eight levels of Er, A, B, C, D, E, F, and G are allocated in ascending order to a write voltage. When a write bit value is "XY1" (X and Y each mean "0" or "1"), the write voltage exists on Er or one of E to G. When a write bit value is "XY0", the write voltage exists on one of A to D.

Accordingly, the lower page can be read out by using a threshold voltage $V_A$ in the boundary between Er and A, and a threshold voltage $V_E$ in the boundary between D and E. A readout result obtained by using the threshold voltage $V_A$ is called ARead, and A readout result obtained by using the threshold voltage $V_E$ is called ERead. The hard-decision bit (HBRead) of the lower page is obtained by performing an ENOR operation on the ARead and ERead (see "Lower" in FIG. 5).

Also, one of the soft-decision bits of the lower page is obtained by performing an ENOR operation on readout results obtained by using a threshold voltage $V_{A+2\Delta R}$ higher by two steps than the threshold voltage $V_A$, a threshold voltage $V_{A-2\Delta R}$ lower by two steps than the threshold voltage $V_A$, a threshold voltage $V_{E+2\Delta R}$ higher by two steps than the threshold voltage $V_E$, and a threshold voltage $V_{E-2\Delta R}$ lower by two steps than the threshold voltage $V_E$ (see "ENOR (SB1)" in FIG. 5).

Furthermore, one of the soft-decision bits of the lower page is obtained by performing an ENOR operation on readout results obtained by using a threshold voltage $V_{A+3\Delta R}$ higher by three steps than the threshold voltage $V_A$, a threshold voltage $V_{A-3\Delta R}$ lower by three steps than the threshold voltage $V_A$, a threshold voltage $V_{A+\Delta R}$ higher by one step than the threshold voltage $V_A$, a threshold voltage $V_{A-\Delta R}$ lower by one step than the threshold voltage $V_A$, a threshold voltage $V_{E+3\Delta R}$ higher by three steps than the threshold voltage $V_E$, a threshold voltage $V_{E-3\Delta R}$ lower by three steps than the threshold voltage $V_E$, a threshold voltage $V_{E+\Delta R}$ higher by one step than the threshold voltage $V_E$, and a threshold voltage $V_{E-\Delta R}$ lower by one step than the threshold voltage $V_E$ (see "ENOR3 (SB2)" in FIG. 5). A readout result obtained by using a threshold voltage $V_C$ in the boundary between C and D is also one of the soft-decision bits of the lower page (see "CRead (SB3)" in FIG. 5).

The four bits "CRead (SB3)", "ENOR3 (SB2)", "ENOR (SB1)", and "Lower" are used as an index (see "index" in FIG. 5) indicating a corresponding read level (RD). For example, an index "15" (=1111) indicates the lowest read level "0" (i.e., $V_{A-3\Delta R}$ or less). On the other hand, an index "7" (=0111) indicates the highest read level "15" (i.e., $V_{E+3\Delta R}$ or more).

The LDPC decoder 5 converts the readout data into the likelihood information in accordance with the set table. In the following explanation, it is assumed that the likelihood information is an LLR, and the table is an LLR table (i.e., a table for associating the readout data with the LLR).

The LDPC decoder 5 iteratively performs decoding by using the LLR. If an LDPC frame is successfully decoded, the LDPC decoder 5 can provide the decoded LDPC frame to, e.g., a data processor (not shown). Also, when executing the DLE, the LDPC decoder 5 provides the successfully decoded LDPC frame to the DLE calculation section 6.

When executing the DLE, the DLE calculation section 6 receives one or more successfully decoded LDPC frames from the LDPC decoder 5, and receives the LDPC frames before decoded read out from the nonvolatile memory 2 via a memory interface (not shown) and the built-in memory 4.

When executing the DLE, the DLE calculation section 6 detects a correct bit value and read level (or the above-described index) for each bit forming the LDPC frame of the calculation target. The correct bit value can be detected by referring to the bit value of the decoded LDPC frame. The DLE calculation section 6 generates a channel matrix as calculation data by counting the number of times a combination of the correct bit value and read level appears. The DLE calculation section 6 provides the channel matrix to the firmware 8.

Figure 6:
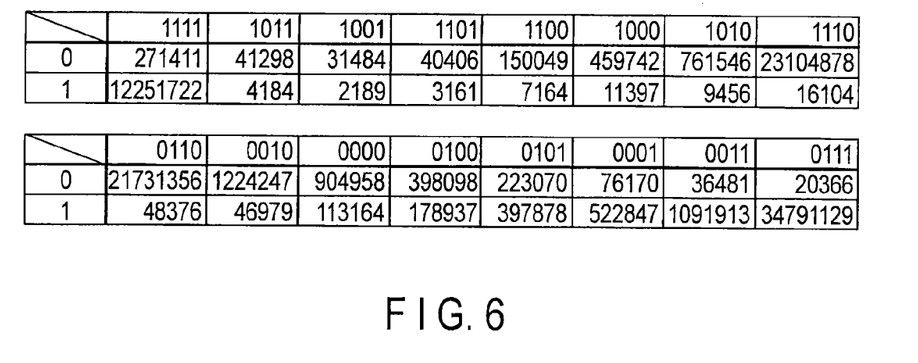
FIG. 6 is a table showing an example of a channel matrix of the lower page.

More specifically, the DLE calculation section 6 can generate a channel matrix shown in FIG. 6 for a 2-3-2 code type lower page. The size of the matrix shown in FIG. 6 is 2 rows×16 columns. Each row represents a correct bit value, and each column represents an index corresponding to a read level. For example, when the correct bit value of a given bit in an LDPC frame of the calculation target is "1" and an index of the read level is "1111", the DLE calculation section 6 counts up an element in the first row and first column of the channel matrix by 1.

When executing the DLE, the firmware 8 is supplied with the channel matrix from the DLE calculation section 6. The firmware 8 creates the new LLR table Tn+1 based on the channel matrix. The firmware 8 sets the new LLR table in the LDPC decoder 5 as needed.

Figure 7:
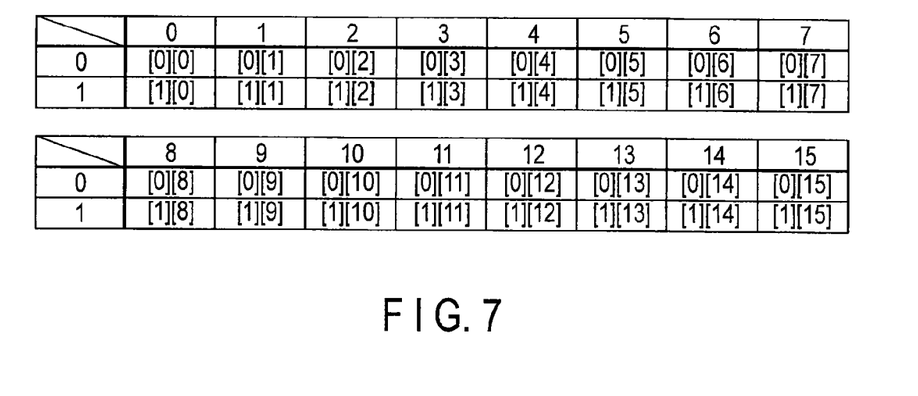
FIG. 7 is a table showing an example of a two-dimensional array for referring to elements of the channel matrix shown in FIG. 6.

More specifically, the firmware 8 creates the new LLR table Tn+1 by statistically calculating the likelihood (i.e., the LLR) of the correct bit value of each read level based on the channel matrix. For example, when explaining the elements of the channel matrix shown in FIG. 6 by referring to a two-dimensional array shown in FIG. 7, the firmware 8 can statistically calculate the LLR of the correct bit value of each read level (RD=0, . . . , 15) by using an equation (1) below.

$$LLR[RD] = \text{Ln}\left[\frac{[0][RD]}{\sum_{j=0}^{15}[0][j]} \middle/ \frac{[1][RD]}{\sum_{j=0}^{15}[1][j]}\right] \quad (1)$$

Note that the firmware 8 need not strictly calculate the equation (1). For example, Ln[0] and Ln[∞] cannot numerically be calculated. If "0" exists as an element in the matrix, therefore, the firmware 8 can calculate the equation (1) by replacing this element with a natural number having a small absolute value, e.g., "1". Also, if the absolute value of the LLR[RD] is very large, the firmware 8 can perform, e.g., scaling or clipping as needed. For example, the firmware 8 can set the LLR[RD] within the range of values that can be allowed by a system configuration or circuit configuration.

In addition, LLR=0 is theoretically possible as a calculation result, but the LDPC decoder 5 may cause an operation error if LLR=0 occurs too often. If LLR[RD]=0 is calculated by the equation (1), therefore, the firmware 8 can create the new LLR table Tn+1 by replacing the LLR[RD] with an integer having a small absolute value, e.g., "1" or "−1". For example, if 0 LLR[RD]<1, the firmware 8 can round this LLR[RD] to "1". If −1<LLR[RD]<0, the firmware 8 can round this LLR[RD] to "−1".

The controller 3 typically executes the DLE as needed when the decoding of the LDPC frame has failed. Since the correct bit value of the unsuccessfully decoded LDPC frame is unknown, no LLR can be created based on this LDPC frame. However, it is highly likely that a stress on a given memory cell is similar to a stress on another geographically close memory cell. That is, the Vth distribution of a given memory cell can be approximated to that of another geographically close memory cell. Accordingly, the LDPC decoder 5 preferably preferentially decodes an LDPC frame stored in an area geographically close to an unsuccessfully decoded LDPC frame.

Figure 8:
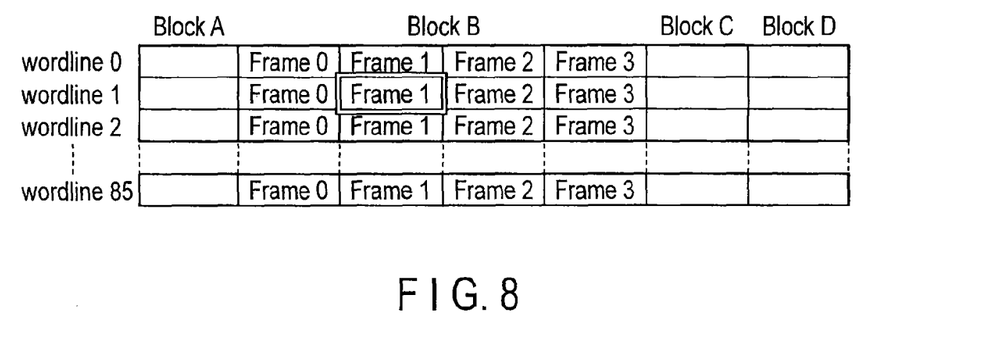
FIG. 8 is a view showing an example of an LDPC frame decoded preferentially when a dynamic LLR estimation (DLE) is executed.

Assume that decoding of a Frame 1 (this frame is called an LDPC frame of interest) of a word line 1 in a Block B shown in FIG. 8 has failed. In this case, the LDPC decoder 5 can decode a Frame 0, Frame 2, or Frame 3 of the word line 1 in the Block B (i.e., another LDPC frame stored in the same page as that of the LDPC frame of interest) in preference to LDPC frames stored in different pages.

The LDPC decoder 5 can also decode another arbitrary frame in the Block B (i.e., another LDPC frame stored in the same block as that of the LDPC frame of interest), and another arbitrary frame of the word line 1 (i.e., another LDPC frame stored in the same word line as that of the LDPC frame of interest), in preference to LDPC frames stored in different blocks and different word lines.

Furthermore, the LDPC decoder 5 can decode another LDPC frame stored in the same plane as that of the LDPC frame of interest in preference to LDPC frames stored in different planes. Note that if an area subjected to a stress similar to that on the LDPC frame of interest can be derived from an element other than the geographical condition, the LDPC decoder 5 can preferentially decode another LDPC frame stored in the area regardless of the geographical condition of the area.

Figure 9:
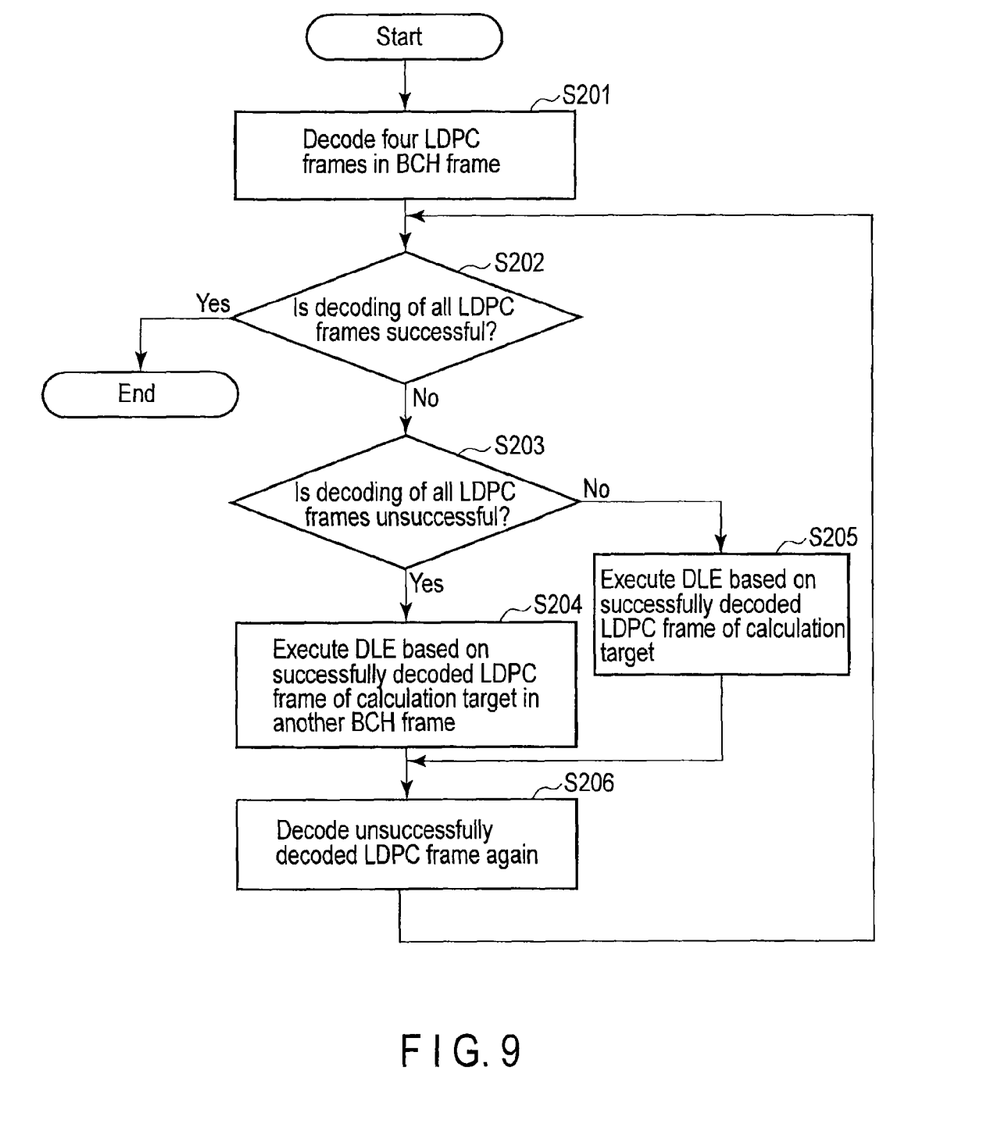
FIG. 9 is a flowchart showing an example of a decoding operation of an LDPC frame according to a second embodiment.

The controller 3 executes the DLE as needed during a decoding operation shown in, e.g., FIG. 9. This decoding operation shown in FIG. 9 decodes a total of four LDPC frames forming one arbitrary BCH frame.

First, the LDPC decoder 5 iteratively decodes each of four LDPC frames forming a target BCH frame (step S201). More specifically, the LDPC decoder 5 receives readout data corresponding to each of the four LDPC frames, converts the readout data into the LLR in accordance with the LLR table set by the firmware 8, and iteratively performs decoding by using the LLR. After step S201, a process advances to step S202.

In step S202, if it is determined that the LDPC decoder 5 has succeeded in decoding all the LDPC frames, the process is terminated. On the other hand, in step S202, if it is determined that the LDPC decoder 5 has failed in decoding at least one LDPC frame, the process advances to step S203.

In step S203, if it is determined that the LDPC decoder 5 has failed in decoding all the LDPC frames, the process advances to step S204. On the other hand, in step S203, if it is determined that the LDPC decoder 5 has succeeded in decoding at least one LDPC frame, the process advances to step S205.

In step S204, the controller 3 executes the DLE. Since, however, decoding of all the LDPC frames forming the target BCH frame has failed, it is necessary to create the new LLR table Tn+1 based on one or more LDPC frames forming another BCH frame. Therefore, the LDPC decoder 5 decodes one or more LDPC frames forming another BCH frame. The DLE calculation section 6 generates the channel matrix by counting the number of times a combination of a correct bit value and read level appears, for each bit of one or more successfully decoded LDPC frames of the calculation target. The firmware 8 creates the new LLR table Tn+1 by statistically calculating the LLR of the correct bit value of each read level based on the channel matrix. After step S204, the process advances to step S206. In step S205, the controller 3 executes the DLE as well. However, one or more LDPC frames have successfully been decoded unlike in step S204, so the new LLR table Tn+1 can be created based on the LDPC frames of the calculation target. It is also possible to perform a process identical to or similar to above-described step S204, instead of step S205. Either way, the DLE calculation section 6 generates the channel matrix by counting the number of times the combination of the correct bit value and read level appears, for each bit of the one or more successfully decoded LDPC frames of the calculation target. The firmware 8 creates the new LLR table Tn+1 by statistically calculating the LLR of the correct bit value of each read level based on the channel matrix. After step S205, the process advances to step S206.

In step S206, the LDPC decoder 5 decodes the unsuccessfully decoded LDPC frame (the LDPC frame of interest) again, in accordance with the LLR created by the DLE executed in step S204 or S205. After step S206, the process returns to step S202.

Note that if step S204 or S205 is executed a plurality of times, it is also possible to create the new LLR table Tn+1 based on an LDPC frame different from the LDPC frame referred to in the past.

In this operation example shown in FIG. 9, the DLE is executed when the LDPC frame is unsuccessfully decoded. However, it is also possible to additionally execute the DLE under a specific condition in order to prevent unsuccessful decoding of the LDPC frame.

Figure 10:
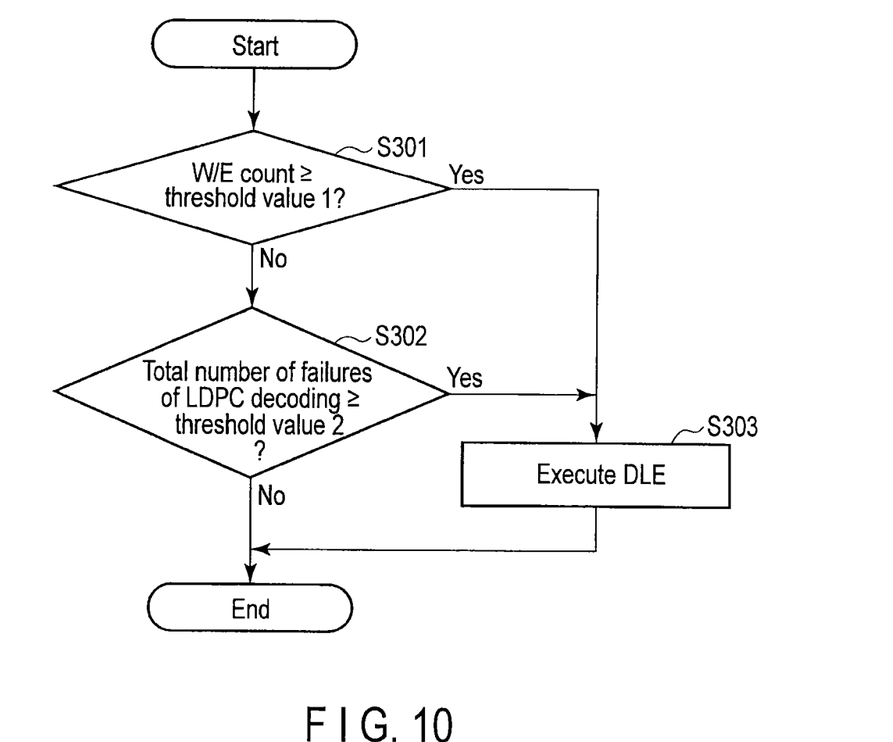
FIG. 10 is a flowchart showing an example of an execution condition of an additional DLE.

For example, as shown in FIG. 10, the DLE can be executed (step S303) if a W/E count has reached a threshold value (step S301), or if the total number of failures of LDPC decoding has reached a threshold value (step S302). Note that the total number of failures of LDPC decoding in step S302 is incremented when LDPC decoding is unsuccessful but BCH decoding is successful (i.e., when no DLE is executed in the operation example shown in FIG. 9).

Figure 11:
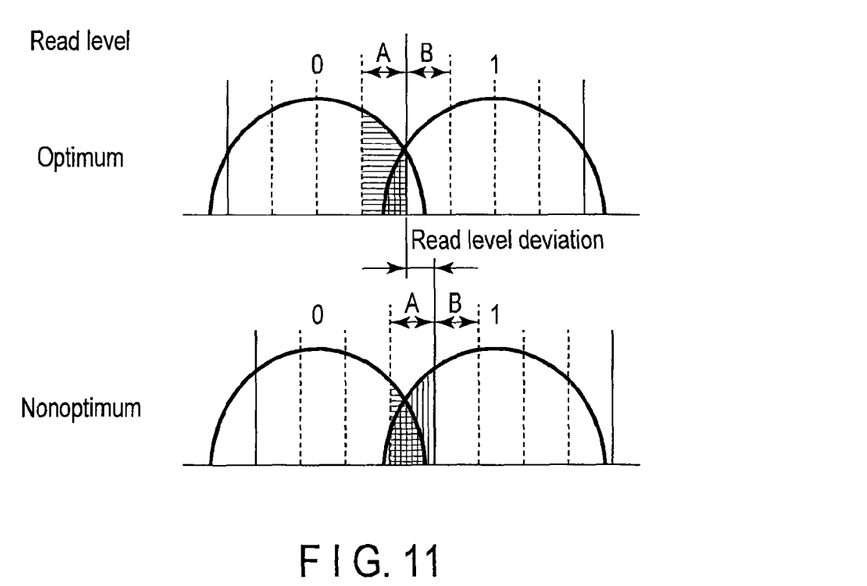
FIG. 11 is a view showing an example of an influence of an LLR by a failure of Vth tracking.

Furthermore, the DLE can be executed when, e.g., the number of trials of iterative decoding has reached a threshold value, or "Vth tracking" is performed. "Vth tracking" herein mentioned means a process of adjusting the threshold voltage to aim at a boundary value at which adjacent Vth distributions intersect each other, in order to minimize an error included in readout data from a memory cell having a largely shifted Vth distribution (e.g., a memory cell strongly subjected to DR stress). When Vth tracking is performed, the threshold voltage for use in read shifts. Ideally, the threshold voltage is set to a boundary value (i.e., an optimum value)

at which adjacent Vth distributions intersect each other as shown in FIG. 11. A pre-created LLR table is generally based on the premise that an almost optimum threshold voltage is set under a given stress. If Vth tracking is successful, therefore, the LLR close to an actual value can be derived through the LLR table.

On the other hand, if Vth tracking is unsuccessful, the threshold voltage is set to deviate from the boundary value. For example, if the threshold voltage is set to deviate from the boundary value to the high-voltage side, an LLR corresponding to read level A shown in FIG. 11 must have a negative value (the probability that correct bit value=1 is higher than the probability that correct bit value=0). In the example shown in FIG. 11, however, the optimized LLR table converts read level A into a positive LLR (the probability that correct bit value=0 is higher than the probability that correct bit value=1). That is, if Vth tracking fails, the sign of an LLR corresponding to a read level near the boundary value readily inverts with respect to an actual value.

Accordingly, it is possible, by executing the DLE when Vth tracking is performed, to create the new LLR table Tn+1 that converts the read level into the LLR close to an actual value regardless of whether Vth tracking is successful or unsuccessful. That is, it is possible to suppress deterioration of the error correctability of the LDPC decoder 5, which is caused by a failure of Vth tracking.

As explained above, when the DLE is executed, the controller 3 according to the second embodiment generates the channel matrix and statistically calculates the LLR of the correct bit value of each read level based on the channel matrix, thereby creating the new LLR table Tn+1. This controller 3 generates the channel matrix by preferentially referring to the successfully decoded LDPC frame stored in an area highly likely to be subjected to stress similar to that on an LDPC frame of interest. Accordingly, this controller 3 can dynamically create the new LLR table Tn+1 adapted to the stress applied to the memory area of the LDPC frame of interest. That is, this controller 3 can stably convert readout data into appropriate likelihood information and correct an error regardless of the stress applied to the memory area of the LDPC frame of interest.

Note that in this embodiment, a successfully decoded LDPC frame of the calculation target is referred to in order to generate the channel matrix. However, it is conditionally also possible to refer to an unsuccessfully decoded LDPC frame. More specifically, if the number of NG syndromes for a given LDPC frame is equal to or smaller than a threshold value (e.g., 10) at the end of decoding, the channel matrix may be generated by referring to this LDPC frame. This threshold value can be determined based on a local structure (trapping set) included in a parity check matrix for use in iterative decoding of LDPC frames.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller comprising:
a decoder that converts a plurality of error correction code (ECC) frames read out from a nonvolatile semiconductor memory into likelihood information based on a set table among a plurality of log-likelihood ratio (LLR) tables, generates a plurality of decoded ECC frames by decoding using the likelihood information and switches the set table when there is an ECC frame in which the decoding is unsuccessful;
a calculation section that generates calculation data based on an ECC frame of calculation target among the plurality of decoded ECC frames and an ECC frame before decoded, which corresponds to the ECC frame of the calculation target, the ECC frame of calculation target being a successfully-decoded ECC frame;
a table creation section that creates a new LLR table by executing statistical calculation based on the calculation data generated by the calculation section and sets the new LLR table to the decoder; and
a control section that controls the calculation target so that a calculation in the calculation section is not repeated for an ECC frame in which the decoding is successful,
wherein the decoder decodes the ECC frames based on the new LLR table,
wherein the ECC frame before decoded includes a readout level of each of a plurality of bits,
wherein the calculation section generates a channel matrix by counting a number of times of a combination of a correct bit value and a readout level for each bit included in the ECC frame of the calculation target based on the ECC frame of the calculation target and the ECC frame before decoded, and
wherein the table creation section statistically calculates, based on the channel matrix, a likelihood of the correct bit value for each of the readout level included in the ECC frame of the calculation target, and creates the new LLR table.

2. The controller of claim 1,
wherein the control section sets each of the plurality of decoded ECC frames to the calculation target in the calculation section only once when the decoding is successful.

3. The controller of claim 1,
wherein the control section sets an ECC frame in which the decoding is successful and the calculation has not been applied yet to the calculation target in the calculation section, and excludes an ECC frame in which the decoding is unsuccessful and an ECC frame in which the decoding is successful but the calculation has been already applied from the calculation target in the calculation section.

4. The controller of claim 1,
wherein the control section executes an initialization for a control of the calculation target when a plurality of new ECC frames are read out from the nonvolatile semiconductor memory.

5. The controller of claim 1,
wherein the table creation section is realized by firmware executed by a processor,
wherein the firmware controls the control section, generates the new LLR table based on a result of the decoding by the decoder and the calculation data generated by the calculation section, sets the new LLR table to the decoder and causes the decoder to retry the decoding, and
wherein the control section is configured by hardware.

6. The controller of claim 1,
wherein the table creation section is configured by hardware, controls the control section, creates the new LLR table based on a result of the decoding by the decoder and the calculation data generated by the calculation section, sets the new LLR table to the decoder and causes the decoder to retry the decoding, and
wherein the control section is configured by hardware.

7. The controller of claim 1, wherein the decoder is a low density parity check (LDPC) decoder, and wherein the controller further comprises a Bose-Chaudhuri-Hocquenghem (BCH) decoder that performs BCH decoding for the plurality of decoded ECC frames when the decoding for all the plurality of ECC frames is successful.

8. The controller of claim 1,
wherein the calculation section comprises a plurality of switches corresponding to each of the plurality of decoded ECC frames, and
wherein the control section controls whether or not each of the plurality of decoded ECC frames becomes the calculation target by switching on/off the plurality of switches.

9. A semiconductor memory device comprising:
a nonvolatile semiconductor memory; and
a controller that controls the nonvolatile semiconductor memory,
wherein the controller comprises:
a decoder that converts a plurality of error correction code (ECC) frames read out from a nonvolatile semiconductor memory into likelihood information based on a set table among a plurality of tables, generates a plurality of decoded ECC frames by decoding using the likelihood information and switches the set table when there is an ECC frame in which the decoding is unsuccessful;
a calculation section that generates calculation data based on an ECC frame of calculation target among the plurality of decoded ECC frames and an ECC frame before decoded, which corresponds to the ECC frame of the calculation target, the ECC frame of calculation target being a successfully-decoded ECC frame;
a table creation section that creates a new log-likelihood ratio (LLR) table by executing statistical calculation based on the calculation data generated by the calculation section and sets the new LLR table to the decoder; and
a control section that controls the calculation target so that a calculation in the calculation section is not repeated for an ECC frame in which the decoding is successful,
the decoder decodes the ECC frames based on the new LLR table,
the ECC frame before decoded includes a readout level of each of a plurality of bits,
the calculation section generates a channel matrix by counting a number of times of a combination of a correct bit value and a readout level for each bit included in the ECC frame of the calculation target based on the ECC frame of the calculation target and the ECC frame before decoded, and
the table creation section statistically calculates, based on the channel matrix, a likelihood of the correct bit value for each of the readout level included in the ECC frame of the calculation target, and creates the new LLR table.

10. The semiconductor memory device of claim 9,
wherein the control section sets each of the plurality of decoded ECC frames to the calculation target in the calculation section only once when the decoding is successful.

11. The semiconductor memory device of claim 9,
wherein the control section sets an ECC frame in which the decoding is successful and the calculation has not been applied yet to the calculation target in the calculation section, and excludes an ECC frame in which the decoding is unsuccessful and an ECC frame in which the decoding is successful but the calculation has been already applied from the calculation target in the calculation section.

12. The semiconductor memory device of claim 9,
wherein the control section executes an initialization for a control of the calculation target when a plurality of new ECC frames are read out from the nonvolatile semiconductor memory.

13. The semiconductor memory device of claim 9,
wherein the table creation section is realize by firmware executed by a processor,
wherein the firmware controls the control section, generates the new LLR table based on a result of the decoding by the decoder and the calculation data generated by the calculation section, sets the new LLR table to the decoder and causes the decoder to retry the decoding, and
wherein the control section is configured by hardware.

14. The semiconductor memory device of claim 9,
wherein the table creation section is configured by hardware, controls the control section, creates the new LLR table based on a result of the decoding by the decoder and the calculation data generated by the calculation section, sets the new LLR table to the decoder and causes the decoder to retry the decoding, and
wherein the control section is configured by hardware.

15. The semiconductor memory device of claim 9, wherein the decoder is a low density parity check (LDPC) decoder, and wherein the controller further comprises a Bose-Chaudhuri-Hocquenghem (BCH) decoder that performs BCH decoding for the plurality of decoded ECC frames when the decoding for all the plurality of ECC frames is successful.

16. The semiconductor memory device of claim 9,
wherein the calculation section comprises a plurality of switches corresponding to each of the plurality of decoded ECC frames, and
wherein the control section controls whether or not each of the plurality of decoded ECC frames becomes the calculation target by switching on/off the plurality of switches.

* * * * *